United States Patent
Zhao et al.

(10) Patent No.: US 6,897,797 B2
(45) Date of Patent: May 24, 2005

(54) DIGITAL TO ANALOG CONVERTER WITH INTEGRAL INTERSYMBOL INTERFERENCE CANCELLATION

(75) Inventors: Lixin Zhao, Fremont, CA (US); Zhongxuan Zhang, Fremont, CA (US)

(73) Assignee: UTStarcom, Inc., Alameda, CA (US)

( * ) Notice: Subject to any disclaimer, the term of this patent is extended or adjusted under 35 U.S.C. 154(b) by 59 days.

(21) Appl. No.: 10/674,660

(22) Filed: Sep. 29, 2003

(65) Prior Publication Data

US 2005/0068215 A1 Mar. 31, 2005

(51) Int. Cl.[7] ................................................. H03M 1/66
(52) U.S. Cl. ........................ 341/144; 341/145; 341/153
(58) Field of Search ................................. 341/118, 120, 341/143, 144, 153

(56) References Cited

U.S. PATENT DOCUMENTS

| | | | | |
|---|---|---|---|---|
| 6,118,398 A | * | 9/2000 | Fisher et al. ................. | 341/144 |
| 6,340,940 B1 | * | 1/2002 | Melanson ..................... | 341/143 |
| 6,424,283 B2 | * | 7/2002 | Bugeja et al. .............. | 341/145 |
| 6,469,648 B2 | * | 10/2002 | Nakao et al. ................ | 341/153 |
| 6,535,155 B2 | * | 3/2003 | Ruha et al. .................. | 341/144 |
| 6,556,161 B2 | * | 4/2003 | Nuijten ....................... | 341/144 |
| 6,621,439 B1 | * | 9/2003 | Bugeja ........................ | 341/145 |
| 6,771,199 B2 | * | 8/2004 | Brooks et al. ............... | 341/143 |

* cited by examiner

*Primary Examiner*—Michael Tokar
*Assistant Examiner*—Linh V Nguyen
(74) *Attorney, Agent, or Firm*—Felix L. Fischer

(57) ABSTRACT

A digital to analog converter (DAC) for a communications system with reduced intersymbol interference incorporates dynamic element matching (DEM) with a matching element array having 2M bits for an input corresponding to M+1 levels thereby employing only one half the range of the DEM and array to produce the DAC output.

5 Claims, 5 Drawing Sheets

DIGITAL TO ANALOG CONVERTER WITH INTEGRAL INTERSYMBOL INTERFERENCE CANCELLATION

BACKGROUND OF THE INVENTION

1. Field of the Invention

This invention relates generally to the field of digital to analog converters (DAC) for communications applications. More particularly, the invention provides a DAC with integral intersymbol interference (ISI) cancellation based on the inherent characteristics of dynamic element matching (DEM).

2. Description of Related Art

DACs for communications systems typically employ an oversampling architecture with dynamic element matching (DEM) for improve linearity {noise reduction}. DEM is the preferred scrambling technique used to overcome the harmonic distortion that would be present in thermometer style decoding if assignment of each particular bit was active only during a particular input code. With DEM, correlation between the bit output from the scrambler and the particular input value is eliminated. Errors which would be introduced by bit-weights in the DAC are therefore de-correlated from the signal.

Even with DEM, dynamic non-linearity problems exist which impact the performance of the DAC. Extensive work in the prior art for return to zero (RZ) architectures to reduce this dynamic non-linearity has been done. However, such RZ architectures add significant complexity to the overall architecture design and may introduce further non-linearity {noise} issues associated with RZ wave shape itself.

It is therefore desirable to reduce ISI without added circuit complexity and the additional noise creation inherent in RZ architectures for DACs.

SUMMARY OF THE INVENTION

A DAC with an M bit input employs a 2M matching element array in conjunction with a 2M bit DEM logic to provide an inherently linear DAC output to reduce ISI.

BRIEF DESCRIPTION OF THE DRAWINGS

These and other features and advantages of the present invention will be better understood by reference to the following detailed description when considered in connection with the accompanying drawings wherein.

DETAILED DESCRIPTION OF THE INVENTION

Figure 1:
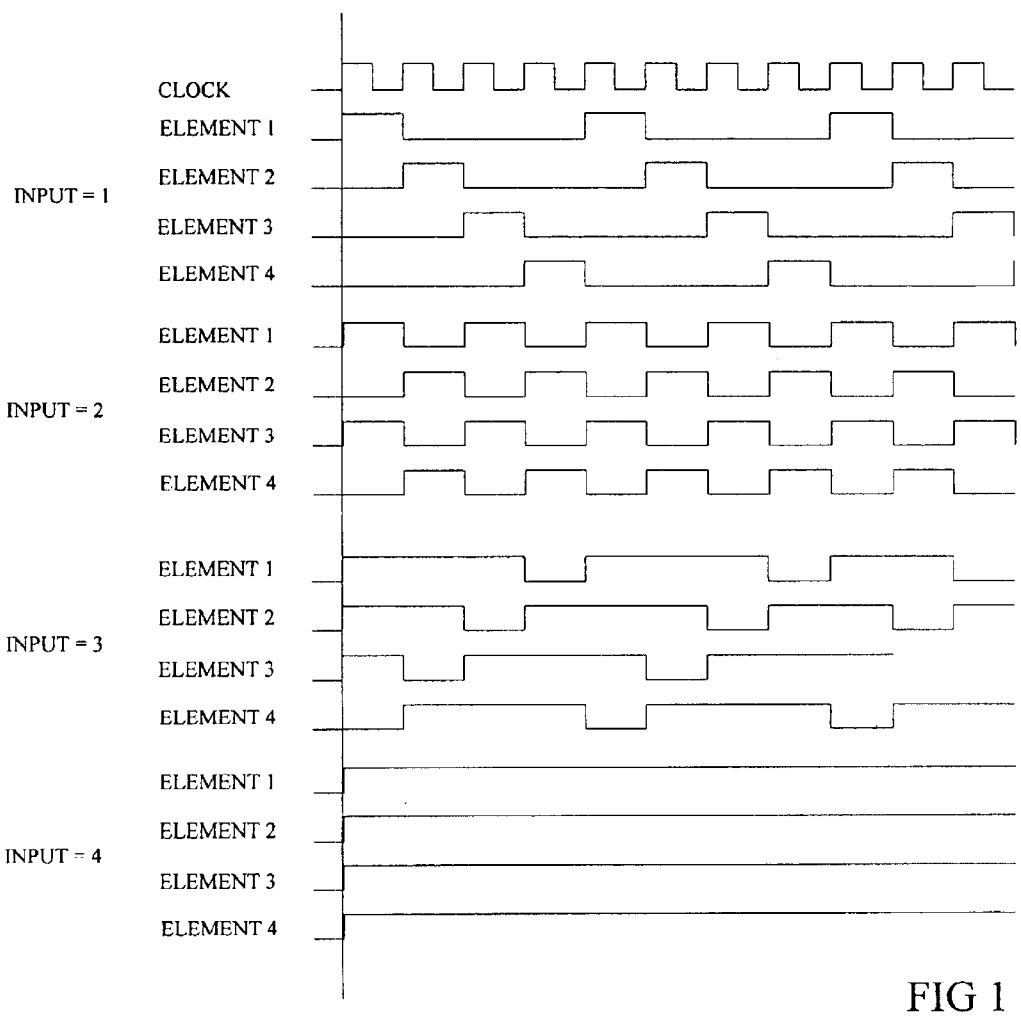
FIG. 1 is a waveform diagram for the range of inputs in an exemplary four element DAC.

Referring to the drawings, the waveforms for a four element DAC using DEM logic and a matching element array are shown in FIG. 1. For an input of "1", each element is selected by the DEM logic for a single clock period. Similarly, for an input of "2", alternating elements are selected in each clock period, with each remaining high for only one clock period. A square wave shape for the activated elements has been shown for simplicity. Those skilled in the art will recognize that rise and decay of the element waveform will be dependent on the circuit characteristics. For both values 1 and 2, however, the wave shape will be consistent with a return to zero in only one clock cycle for each activated element. For an input of "3", however, at least two elements as selected by the DEM logic must remain on for longer than one clock cycle. For an input of "4" all elements must remain on. The actual element matching algorithm employed will not alter this result. The resulting response of the DAC will be impacted by the altered wave shape created by the multiple clock cycle "on" condition of the elements.

Figure 2:
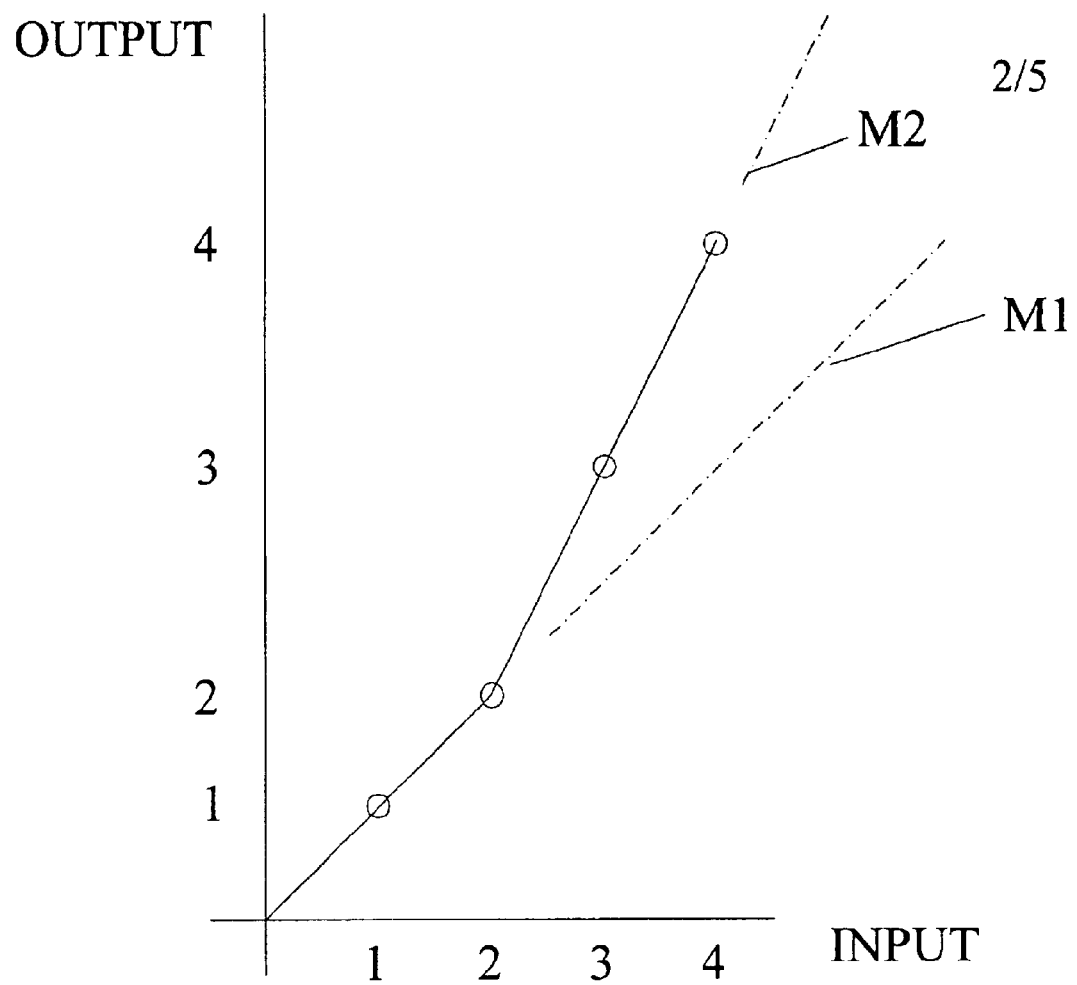
FIG. 2 is a graph demonstrating the slope change and inherent linearity of a ½ of full scale DEM based on the four element waveforms shown in FIG. 1.

As shown in FIG. 2, the output values for inputs of 1 and 2 have a first slope, M1, based on the single clock cycle waveform characteristics of the elements required to produce the output. The output values for inputs of 3 and 4, however, have an altered slope M2, created inherently by the activation of the elements for multiple clock cycles. While the waveform characteristics of each element may not be identical for a single clock cycle, the variation will be significantly lower order than the impact of the multiple clock cycle "on" condition.

Figure 3:
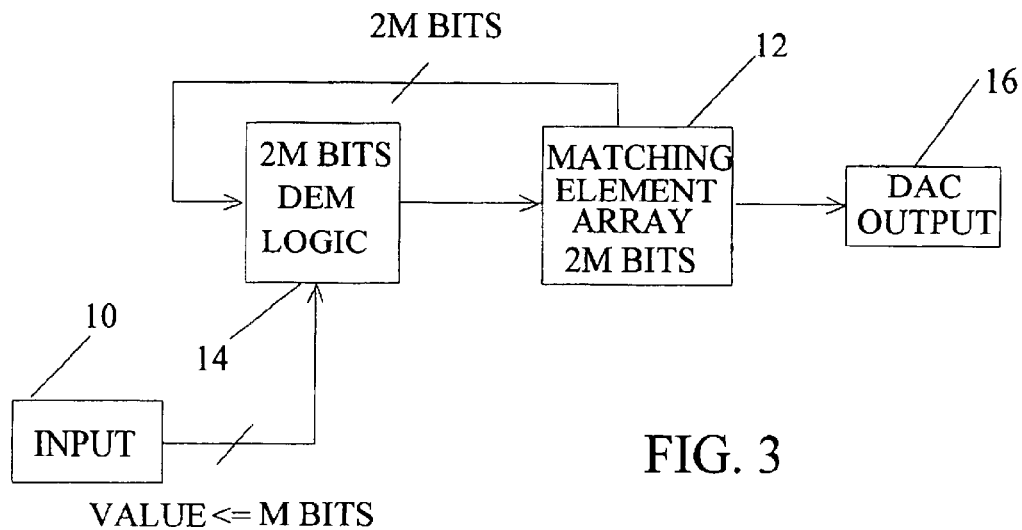
FIG. 3 is a schematic for a DAC employing the present invention.

The present invention relies on the inherent linearity characteristics of a multiple element DAC with DEM described above by employing one half of the full scale range to produce the output of the DAC. An implementation of a DAC according to the invention is shown in FIG. 3 where an input circuit 10 receives an input value of less than or equal to M bits representing M+1 levels, as will be described in greater detail subsequently, which is provided to a DEM having matching element array 12 and DEM logic 14 having 2M bits capability or double the range of the input. The resulting output of the matching element array is then processed through the DAC output 16.

Figure 4:
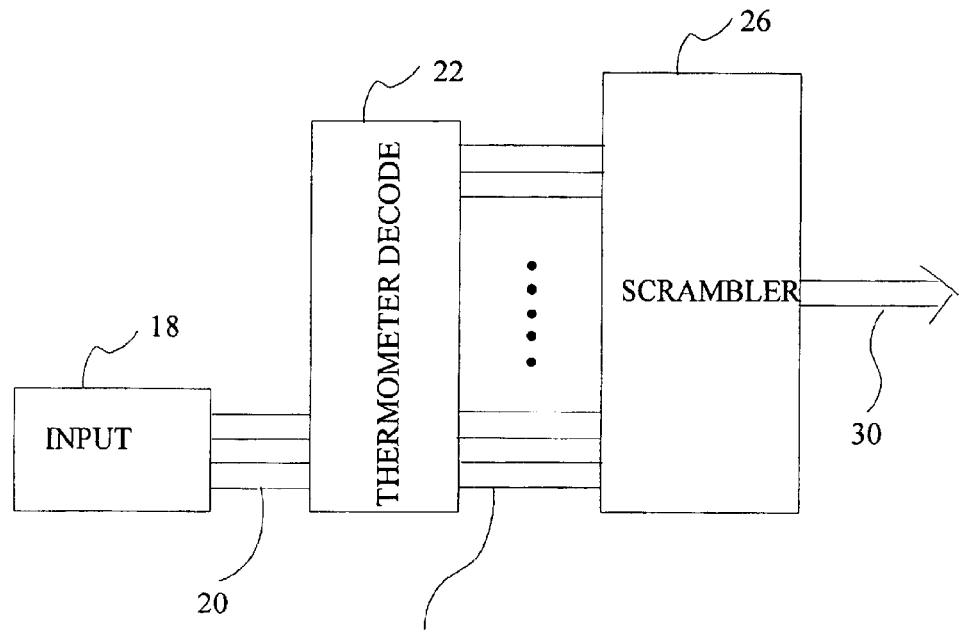
FIG. 4 is a schematic for an embodiment of a DAC employing the invention with 4 bits of input and a first order DEM system with a thermometer decode and scrambler.

FIG. 4 shows an embodiment of the invention described with respect to FIG. 3 for a 4 input bit device using a first order DEM with a thermometer decode and scrambler. Generalized input 18 provides four bits of data on lines 20 to the thermometer decode 22. The value of the input is limited to "8" (1, 0, 0, 0) or less on the four input bits. The thermometer decode has sufficient outputs 24 for a value of "16". However, since the input value is limited, the number of "high" bits output by the thermometer decode will not exceed half its full scale value. The scrambler 26 receives 16 bits of input from the thermometer decode and provides an output 30. Since only half the bits are used in the scrambler the swapping conducted by the scrambler results in no bit remaining "on" for more that one clock cycle resulting in the desired linearity improvement.

Figure 5:
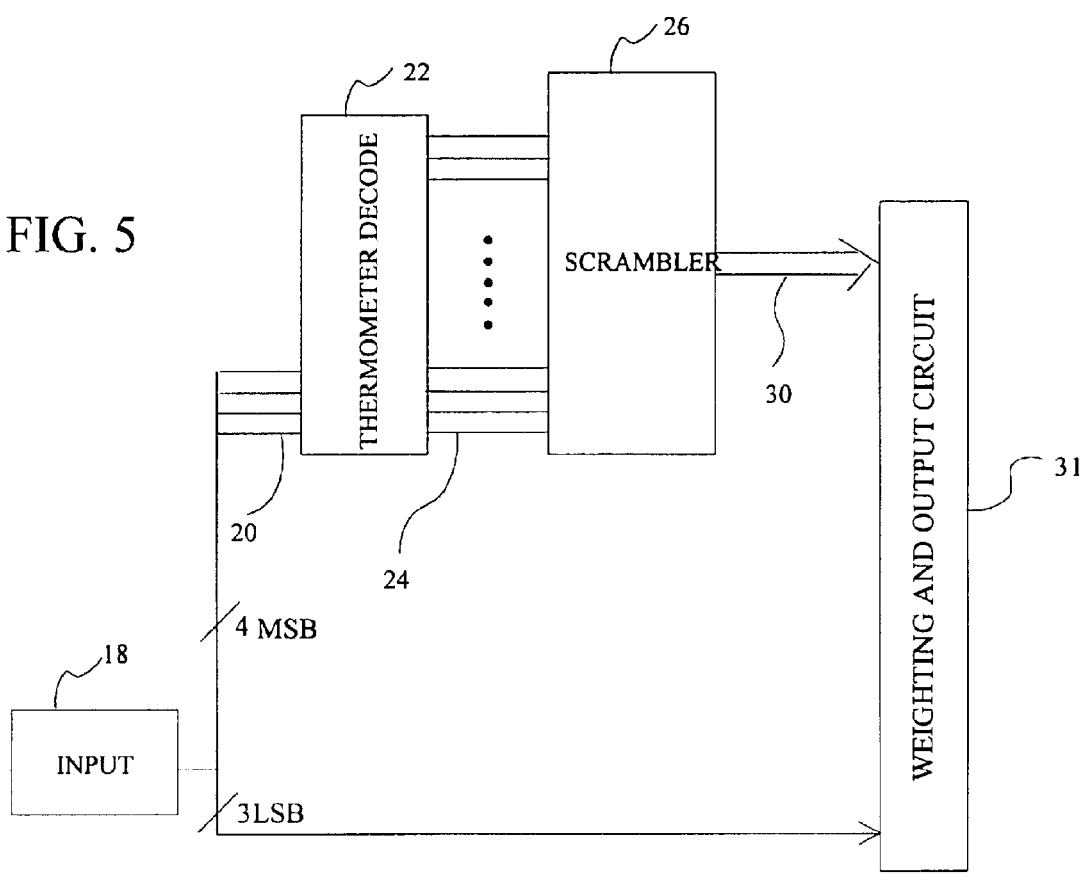
FIG. 5 is a schematic for an embodiment of a segmentation DAC employing the invention with a thermometer decode and scrambler on the most significant bits (MSBs) for linearity improvement.

FIG. 5 demonstrates an embodiment of the invention in a segmentation DAC where the MSBs are provided to a thermometer decode while the LSBs are processed digitally for simplified design. Generalized input 18 in this embodiment provides seven bits of data which are split into four MSBs on lines 20 to the thermometer decode 22 and three LSBs which are processed digitally. The value of the input is limited to "64" (i.e. 1, 0, 0, 0, 0, 0, 0) or less resulting in 1, 0, 0, 0 as a maximum value on the four MSB inputs. The thermometer decode has 16 outputs for the four bit input. However, since the input value is limited, the number of "high" bits output by the thermometer decode will not exceed half its full scale value. The scrambler 26 receives 16 bits of input from the thermometer decode to provide the output 30. Since only half the bits are used in the scrambler the swapping conducted by the scrambler results in no bit remaining "on" for more that one clock cycle resulting in the desired linearity improvement in the MSBs processed. An output circuit 31 properly weights the MSB output and digitally processed LSBs for the DAC output.

Figure 6:
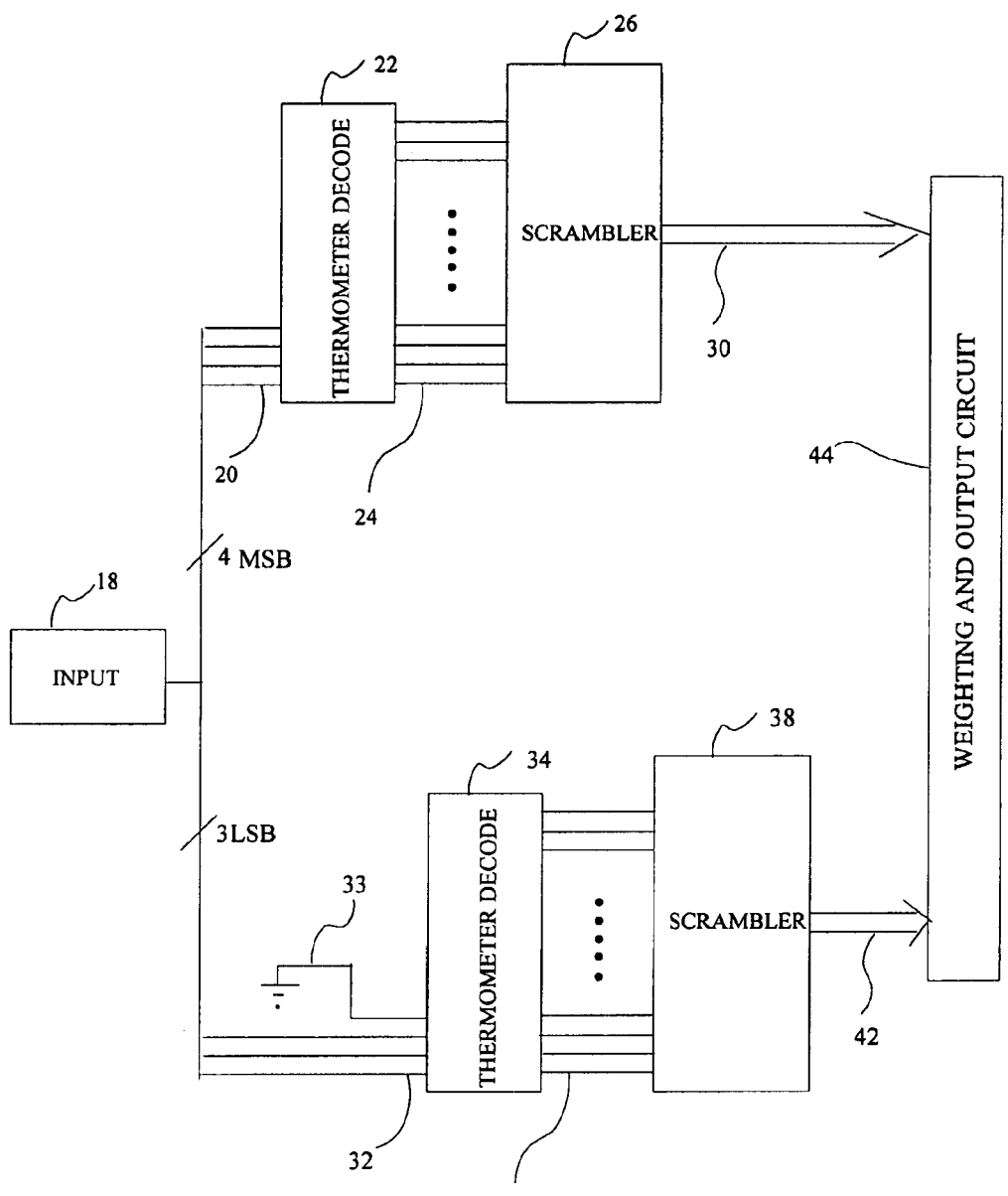
FIG. 6 is a schematic for an embodiment of a segmentation DAC employing the invention with thermometer decoding and scrambling on the MSBs and least significant bits (LSBs) for linearity improvement.

Similarly in FIG. 6, a segmentation DAC is embodied that employs the present invention on both the MSBs and LSBs of the input. Elements and operation with respect to the MSBs are as described with respect to FIG. 5. The three LSBs are routed as inputs 32 to a second thermometer decode 34. An additional bit 33 is added to the input to the second thermometer decode to double the output bits. The second thermometer decode has 16 outputs for the four bit input. Since the input value is effectively limited to the three LSBs of the input, the number of "high" bits output by the thermometer decode will not exceed half its full scale value. The scrambler 38 receives 16 bits 36 of input from the thermometer decode to provide the output 42. Since only half the bits are used in the scrambler the swapping conducted by the scrambler results in no bit remaining "on" for more that one clock cycle resulting in the desired linearity improvement in the LSBs processed. An output circuit 44 properly weights the MSB and LSB outputs for the DAC. While the embodiments shown in FIGS. 4, 5 and 6 are shown with first order DEM circuits, those skilled in the art will recognize that higher order DEM can be employed in alternative embodiments where greater accuracy may be required. Additionally, the number of segments in the segmentation DAC may be varied as required.

The use of double the circuit elements in the DEM and matching element array for a DAC employing the present invention may be considered wasteful. However, any perceived wastefulness is outweighed by the relative simplicity of this circuitry compared to complexity of adding circuit elements required for RZ and other ISI reduction techniques, and the relative manufacturing efficiency of producing additional common circuit elements.

Having now described the invention in detail as required by the patent statutes, those skilled in the art will recognize modifications and substitutions to the specific embodiments disclosed herein. Such modifications are within the scope and intent of the present invention as defined in the following claims.

What is claimed is:

1. A digital to analog converter architecture comprising:

an input circuit for M+1 levels representing a signal, value;

a matching element array having a range of 2M bits connected to the input circuit;

a dynamic element matching logic for 2M bits controlling the matching element array responsive to the signal value; and an output circuit receiving an output from the matching element array.

2. A digital to analog converter architecture as previously defined in claim 1 wherein the input circuit comprises a digital input of M+1 levels connected to a thermometer decode.

3. A digital to analog converter architecture comprising:

an input circuit for X bits representing a signal value, the X bits including M most significant bits;

a matching element array having a range of 2M bits connected to the input circuit;

a dynamic element matching logic for 2M bits controlling the matching element array responsive to the signal value; and an output circuit receiving an output from the matching element array.

4. A digital to analog converter architecture as previously defined in 3 wherein the digital input of M bits is connected to a thermometer decode.

5. A digital to analog converter architecture comprising:

an input circuit for X bits representing a signal value, the X bits including M most significant bits (MSBs) and N least significant bits (LSBs);

a first matching element array having a range of 2M bits connected to the input circuit;

a first dynamic element matching logic for 2M bits controlling the matching element array responsive to the value of the MSBs;

a second matching element array having a range of 2N bits connected to the input circuit;

a second dynamic element matching logic for 2N bits controlling the matching element array responsive to the value of the LSBs; and an output circuit receiving an output from the first and second matching element arrays.

\* \* \* \* \*